US008519758B2

(12) United States Patent
Lee et al.

(10) Patent No.: US 8,519,758 B2
(45) Date of Patent: Aug. 27, 2013

(54) DIGITAL DLL INCLUDING SKEWED GATE TYPE DUTY CORRECTION CIRCUIT AND DUTY CORRECTION METHOD THEREOF

(75) Inventors: Won Lee, Gunpo-si (KR); Donghwan Lee, Seongnam-si (KR); Seong-Ook Jung, Seoul (KR); Heechai Kang, Seoul (KR); Kyungho Ryu, Seoul (KR); Donghoon Jung, Seoul (KR)

(73) Assignees: Samsung Electronics Co., Ltd., Suwon-si, Gyeonggi-do (KR); Industry-Academic Cooperation Foundation, Yonsei University, Seoul (KR)

( * ) Notice: Subject to any disclaimer, the term of this patent is extended or adjusted under 35 U.S.C. 154(b) by 123 days.

(21) Appl. No.: 13/046,073

(22) Filed: Mar. 11, 2011

(65) Prior Publication Data

US 2011/0221495 A1    Sep. 15, 2011

(30) Foreign Application Priority Data

Mar. 11, 2010   (KR) .................. 10-2010-0021900

(51) Int. Cl.
*H03L 7/06* (2006.01)
*H03K 5/04* (2006.01)

(52) U.S. Cl.
USPC ............ 327/158; 327/149; 327/172; 327/175

(58) Field of Classification Search
USPC .............. 327/149, 153, 158, 161, 172–176
See application file for complete search history.

(56) References Cited

U.S. PATENT DOCUMENTS

| 5,757,218 | A  | * | 5/1998  | Blum ........................... 327/175 |
| 6,801,068 | B2 |   | 10/2004 | Yin |
| 7,057,431 | B2 |   | 6/2006  | Kwak |
| 7,675,337 | B2 | * | 3/2010  | Koo ............................ 327/175 |
| 7,821,310 | B2 | * | 10/2010 | Yun et al. ..................... 327/158 |
| 7,940,103 | B2 | * | 5/2011  | Satoh et al. ................... 327/175 |
| 7,990,194 | B2 | * | 8/2011  | Shim ........................... 327/158 |
| 8,013,645 | B2 | * | 9/2011  | Kuroki et al. ................. 327/158 |
| 8,049,543 | B2 | * | 11/2011 | Kang et al. ................... 327/158 |
| 8,242,821 | B2 | * | 8/2012  | Bae et al. ..................... 327/158 |

FOREIGN PATENT DOCUMENTS

| JP | 11-085308 A      | 3/1999  |
| KR | 10 2003-0084487 A | 11/2003 |
| KR | 10 2003-0090129 A | 11/2003 |

OTHER PUBLICATIONS

Kwak, et al.; A Low Cost High Performance Register-Controlled Digital DLL for 1Gbps x32 DDR SDRAM; Symposium on VLSI Circuits Digest of Technical Papers; 2003; pp. 283-284; 4-89114-034-8, 22-1; United States.

Yang, et al.; A 40-550 MHz Harmonic-Free All-Digital Delay-Locked Loop Using a Variable SAR Algorithm; IEEE Journal of Solid-State Circuits; Feb. 2007; pp. 361-373; vol. 42, No. 2; 0018-9200; IEEE; United States.

* cited by examiner

*Primary Examiner* — Patrick O'Neill
(74) *Attorney, Agent, or Firm* — Lee & Morse, P.C.

(57) ABSTRACT

Provided are a delay locked loop (DLL) that may can be included in a data processing device and may include a duty correction circuit, and a duty correction method of such a DLL. The duty correction method includes aligning a second transition of an output clock at a first transition of a clock for duty correction, sampling the clock for duty correction at the first transition of the output clock to detect an error of a duty cycle, and performing duty correction using a skewed gate chain according to the detected error of a duty cycle.

8 Claims, 8 Drawing Sheets

50:50 Duty Cycle Clock

50:50 Duty Cycle Clock

DIGITAL DLL INCLUDING SKEWED GATE TYPE DUTY CORRECTION CIRCUIT AND DUTY CORRECTION METHOD THEREOF

CROSS-REFERENCE TO RELATED APPLICATIONS

This application claims priority under 35 U.S.C. §119 to Korean Patent Application No. 10-2010-0021900, filed on Mar. 11, 2010, in the Korean Intellectual Property Office, and entitled: "Flip-Flop Circuit and Scan Flip-Flop Circuit," which is incorporated by reference herein in its entirety.

BACKGROUND

1. Field

Embodiments relate to delay locked loops (DLLs) and, more particularly, to a digital DLL including a skewed gate type duty correction circuit and a duty correction method thereof.

2. Description of the Related Art

Typically, a synchronous semiconductor memory device capable of being mounted on a data processing device such as a personal computer, a notebook computer or a portable electronic device adopts a delayed locked loop (hereinafter referred to as "DLL").

A DLL generates an internal clock signal phase-locked with an external clock signal as an output clock signal to perform an operation of a semiconductor device synchronously with the external clock signal. That is, a DLL may be employed to synchronize an internal clock signal with an external clock signal. More particularly, a timing delay unavoidably occurs when an internally used clock signal passes a block buffer and a transmission line of a semiconductor device, so a DLL can serve as a phase adjuster to synchronize the internal clock signal with the external clock signal.

In case of a semiconductor memory device using an output clock signal generated from a DLL, a signal timing margin may be maximally secured when a duty cycle rate of the output clock signal is maintained at 50 percent. However, the duty ratio of the output clock signal frequently deviates from 50 percent due to characteristics of a jitter outside the DLL and non-uniform delay values of delay elements inside the DLL. Thus, a duty correction circuit may be employed by a DLL to perform a duty correction operation.

Especially, in case of devices that are sensitive to a duty of a clock, like a double data rate (DDR) type semiconductor memory device, it is almost essential that a duty correction circuit (hereinafter referred to as "DCC") be embedded in a DLL. That is, a data valid window is reduced as a frequency of a clock signal becomes high. In addition, when data is transmitted and received at a dual edge like the DDR-type semiconductor memory device, the data valid window is further reduced. Thus, a duty cycle of a clock signal must be maintained at a ratio of 50:50 to secure a data valid window as widely as possible.

SUMMARY

One or more embodiments may provide a delay locked loop (DLL). The DLL may include a duty correction circuit receiving duty correction control data and including a skewed gate chain, a fine delay line and a coarse delay line delaying a selection input signal in response to delay control data, a phase detector comparing a phase of a clock for duty correction selected as the selection input signal with a phase of an output clock to generate a first detection value and comparing a phase of an input clock with the phase of the output clock to generate a second detection value, a duty cycle detector comparing the phase of the output clock with the phase of the clock for duty correction to generate a duty detection value after the clock for duty correction and the output clock are aligned with each other, and a delay line controller receiving the first and second detection values and the duty detection value and applying the duty correction control data and the delay control data to the duty correction circuit and the fine and coarse delay lines, respectively.

The skewed gate chain of the duty correction circuit may include a plurality of skewed gates whose logic thresholds lean toward rising or falling transition. Each of the skewed gates may include a NAND gate.

The DLL may further include an initial delay estimator configured to output a counting value obtained by measuring first state pulse width of the input clock applied in the early stage of operation of the DLL.

The phase detector may generate the first detection value by sampling the output clock at a first transition of the clock for duty correction and may generate a second detection value by sampling the output clock at a second transition of the input clock.

The duty cycle detector may generate the duty detection value by sampling the clock for duty correction at a first transition of the output clock after aligning a second transition of the output clock at the first transition of the clock for duty correction. The first state pulse width may be a period where the input clock is maintained at a high level.

The first transition may be a falling edge and the second transition may be a rising edge.

One or more embodiments may provide a duty correction method in a delay locked loop (DLL) including a duty correction circuit. The duty correction method may include aligning a second transition of an output clock at a first transition of a clock for duty correction, sampling the clock for duty correction at the first transition of the output clock to detect an error of a duty cycle, and performing duty correction using a skewed gate chain according to the detected error of a duty cycle.

The first transition may be a falling edge and the second transition may be a rising edge.

Aligning a second transition of an output clock at a first transition of a clock for duty correction may be conducted after measuring high-pulse width of an input clock and controlling delay of a delay line according to the measured value.

A transition to the rising edge may be controlled to lead a transition to the falling edge at the skewed gate chain when the detected error of a duty cycle results from a short high-pulse period. A transition to the falling edge may be controlled to lead a transition to the rising edge at the skewed gate chain when the detected error of a duty cycle results from a long high-pulse period.

One or more embodiments may provide a data processing device including a delay locked loop (DLL). The DLL may include a duty correction circuit receiving duty correction control data to perform duty correction, and a delay line controller applying the duty correction control data to the duty correction circuit according to a duty cycle error.

The duty correction circuit may include a skewed gate chain including a plurality of skewed chain gates whose logic thresholds lean toward a rising transition or a falling transition, an input multiplexer directly applying an input clock to the skewed gate chain or applying the input clock to the skewed gate chain after passing a pre-skewed gate, in response to an input selection control signal, and an output multiplexer selecting an output of a low or high skewed gate in the skewed gate chain in response to an output selection control signal.

The DLL may further include a fine delay line and a coarse delay line delaying a selection input signal in response to delay control data, a phase detector comparing a phase of a clock for duty correction selected as the selection input signal with a phase of an output clock to generate a first detection value and comparing a phase of an input clock with the phase of the output clock to generate a second detection value, a duty cycle detector comparing the phase of the output clock with the phase of the clock for duty correction to generate a duty detection value after the clock for duty correction and the output clock are aligned with each other, and a delay line controller receiving the first and second detection values and the duty detection value and applying the duty correction control data and the delay control data to the duty correction circuit and the fine and coarse delay lines.

The delay line controller may receive the first and second detection values and the duty detection value and may apply the duty correction control data and the delay control data to the duty correction circuit and the fine and coarse delay lines, respectively.

The data processing device may be an SDRAM or a memory controller.

The duty correction control data received by the circuit correction circuit may be generated corresponding to a duty cycle error detected between a first transition of an output clock and a clock for duty correction while a second transition of the output clock is aligned with a first transition of the clock for duty correction.

One or more embodiments may provide a delay locked loop (DLL), including a phase detector configured to determine when a first transition of a clock for duty correction and a second transition of an output clock are aligned, a duty cycle detector configured to compare a phase of the output clock with a phase of the clock for duty correction to generate a duty detection value when the phase detector determines that the clock for duty correction and the output clock are aligned, a delay line controller configured to receive the duty detection value and to output duty correction control data in accordance with the duty detection value, and a duty correction circuit configured to receive the duty correction control data and the output clock, and to output a corrected output clock.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1:
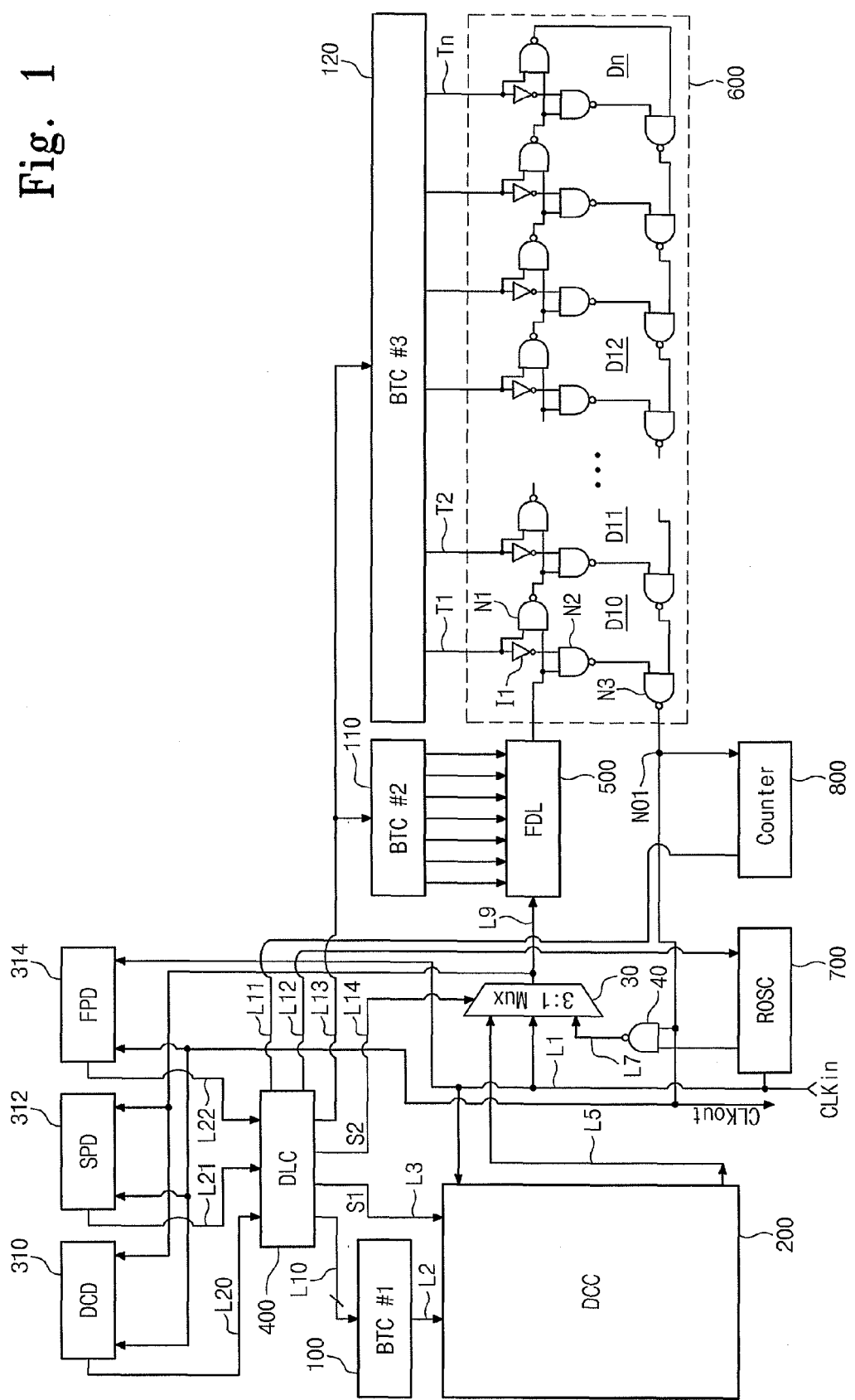
FIG. 1 illustrates a circuit block diagram of an exemplary embodiment of a delay locked loop (DLL)

Korean Patent Application No. 10-2010-0021900, filed on Mar. 11, 2010, in the Korean Intellectual Property Office, and entitled: "Digital DLL Including Skewed Gate Type Duty Correction Circuit and Duty Correction Method Thereof," is incorporated by reference herein in its entirety.

The advantages and features of the inventive concept and methods of achieving them will be apparent from the following exemplary embodiments that will be described in more detail with reference to the accompanying drawings. It should be noted, however, that the inventive concept is not limited to the following exemplary embodiments, and may be implemented in various forms. Accordingly, the exemplary embodiments are provided only to disclose the inventive concept and let those skilled in the art know the category of the inventive concept.

In the drawings, embodiments of the inventive concept are not limited to the specific examples provided herein and are exaggerated for clarity. Furthermore, the same reference numerals denote the same elements throughout the specification.

It will be understood that when an element is referred to as being "connected" or "coupled" to another element, it may be directly connected or coupled to the other element or intervening elements may be present.

Moreover, the same or similar reference numerals represent the same or similar elements throughout the specification. In several drawings, connection relations between elements and parts are merely made for effective explanation of technical contents while other elements or circuit blocks may be further provided.

It is noted that each embodiment described and illustrated herein includes its complementary embodiments as well, and a typical circuit configuration of a DLL or an operation of a DLL having the configuration are omitted to avoid confusion about the key points of the inventive concept.

FIG. 1 illustrates a circuit block diagram of an exemplary embodiment of a delay locked loop (DLL).

Referring to FIG. 1, the DLL may include a duty correction circuit (DCC) 200, a first phase detector (FPD) 314, a second phase detector (SPD) 312, a duty cycle detector (DCD) 310, a fine delay line (FDL) 500, a coarse delay line 600, and a delay line controller (DLC) 400.

Referring to FIG. 1, the DLL may include a ring oscillator start circuit (ROSC) 700 and a NAND gate 40 as a part of an initial delay estimator, which may output a counting value obtained by measuring a width of a first state pulse (e.g., high pulse) of an input clock CLKin applied during an early stage of operation of the DLL. During an early stage of operation of the DLL, the input clock CLKin may be applied to the ring oscillator start circuit 700 and an output of the NAND gate 40 may be supplied to a multiplexer 30. The multiplexer 30 may select an output thereof to be provided to the fine delay line 500. An output of the fine delay line 500 may be applied to a counter 800 sequentially through NAND gates N2, N3. Thus, the NAND gate 40, the multiplexer 30, the fine delay line 500, the NAND gates N2 and N3 may correspond to an initial ring oscillator. In one or more embodiments, the initial delay estimator may include such an initial ring oscillator, the counter 800, and the ring oscillator start circuit 700.

In FIG. 1, multiple, e.g., three, binary to thermometer converters (BTCs) 100, 110, 120 are employed to achieve effective delay control. For example, the first BTC 100 may receive 4 bits of duty correction control data through a line L10. The first BTC 100 may apply the duty correction control data to the duty correction circuit 200.

Figure 2:
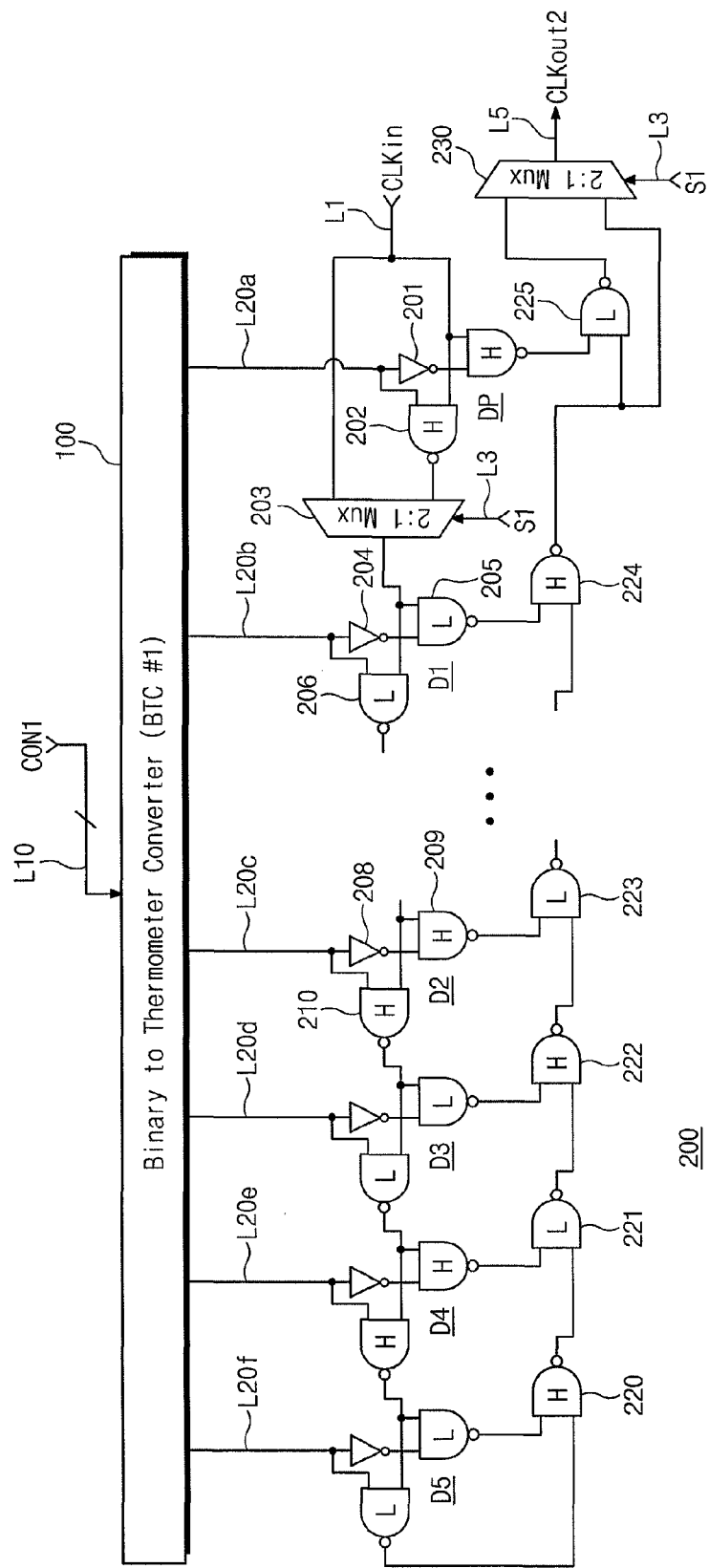
FIG. 2 illustrates an exemplary embodiment of a duty correction circuit (DCC) employable by the DLL of FIG. 1.

The duty correction circuit 200 may be configured using a skewed gate chain (see, e.g., FIG. 2). The duty correction circuit 200 may include skewed gates that favor one edge, e.g., rising or falling edge, over the other. The duty correction circuit 200 may perform a duty correction operation irrespective of delay mismatch.

The fine delay line 500 and the coarse delay line 600 may delay a selection input signal applied through a line L9, e.g., a clock for duty correction, which may be connected to an output terminal of the 3:1 Mux 30) in response to a delay control signal applied through a line L13. The selection input signal may be one of signals applied to lines L7, L1, and L5. The coarse delay line 600 may include unit delay cells D10 through Dn of more delay amounts than a unit delay cell of the fine delay line 500. The unit delay cells D10 through Dn may be connected in cascade and may correspond to one delay chain. Each unit delay cell D10 through Dn may include one inverter I1 and three NAND gates N1, N2, and N3. Each of the unit delay cells D10 through Dn may be activated to participate in a delay operation when a control code of a respective control line T1 to Tn is activated.

The second phase detector 312 may compare phases of a clock for duty correction (clock $CLK_{DCC}$ applied through a line L9) and an output clock $CLK_{out}$ and may generate a first detection value through a line L21. The first detection value may be generated by sampling the output clock $CLK_{out}$ at a first transition (e.g., falling edge) of the duty correction clock $CLK_{DCC}$.

The first phase detector 314 may compare phases of an input clock CLKin and the output clock $CLK_{out}$ and may generate a second detection value through a line L22. The second detection value may be generated by sampling the output clock $CLK_{out}$ at a second transition (e.g., rising edge) of the input clock CLKin.

The DCD 310 may compare the phases of the output clock $CLK_{out}$ and the clock for duty correction $CLK_{DCC}$ and may generate a duty correction value through a line L20 after the clock $CLK_{DCC}$ and the output clock $CLK_{out}$ are aligned with each other. More specifically, the duty correction value may be generated by sampling the clock $CLK_{DCC}$ at a first transition (e.g., falling edge) of the output clock $CLK_{out}$ after the first transition (e.g., falling edge) of the clock $CLK_{DCC}$ and a second transition (e.g., rising edge) of the output clock $CLK_{out}$ are aligned with each other.

The delay line controller 400 may receive the first and second detection values from the second and first phase detectors 312, 314, respectively, and the duty correction value from the DCD 310. The delay line controller 400 may generate the duty correction control data and the delay control data. The delay controller 400 may supply the duty correction control data to the duty correction circuit 200. The delay line controller 400 may supply the delay control data to the fine and coarse delay lines 500 and 600. In accordance with control of the delay line controller 400, the output clock $CLK_{out}$ output through an output node NO1 may accurately have a duty cycle of 50:50 (duty ratio of 50 percent) and may become a clock that is accurately synchronized with the input clock CLKin. Embodiments may be configured so as to provide an output clock CLKout having an improved, i.e., more accurate, 50:50 duty cycle relative to comparable conventional DLLs.

FIG. 2 illustrates an exemplary embodiment of the duty correction circuit (DCC) 200 employable by the DLL of FIG. 1. The DCC 200 may include the skewed gate chain including a plurality of skewed gates D1, D2, . . . , D5, which may each have a logic threshold leaning toward a rising transition or a falling transition. In one or more embodiments, a value corresponding to an error of a duty cycle, e.g., the duty correction value output by the DCD 310, may determine how many of the skewed gates D1, D2, etc. of the duty correction circuit are to be passed.

Further, the DCC 200 may include an input multiplexer 203 and an output multiplexer 230. The input multiplexer 203 may directly apply an input clock to the skewed gate chain or may apply an input clock to the skewed gate chain after passing a pre-skewed gate DP, in response to an input selection control signal S1 of the DCC 200. The output multiplexer 230 may select an output of a low skewed gate 225 or a high skewed gate 224 in the skewed gate chain in response to an output selection control signal S1. The low skewed gate 225 may be a gate configured to favor falling outputs by, e.g., downsizing the PMOS transistors. The high skewed gate 224 may be a gate configured to favor rising outputs by, e.g., downsizing the NMOS transistors.

For example, the skewed gate D1 may include one inverter 204 and three NAND gates 206, 205, and 224. The NAND gates 206 and 205 may be configured such that transition of falling edge is relatively slow while transition of rising edge is relatively fast. The NAND gate 224 may be configured such that transition of falling edge is relatively fast while transition of rising edge is relatively slow. Referring to FIG. 2, gates that may be configured to favor falling outputs or a logic threshold favoring the falling transitions may be identified by "L." Gates that may be configured to favor rising outputs or a logic threshold That is, because a logic threshold favoring the rising transitions may be identified by "H."

Although the skewed gate chain configured using a skewed gate including a NAND gate has been described herein, it will be understood that embodiments are not limited thereto and the skewed gate may be replaced with another equivalent gate.

Figure 3:
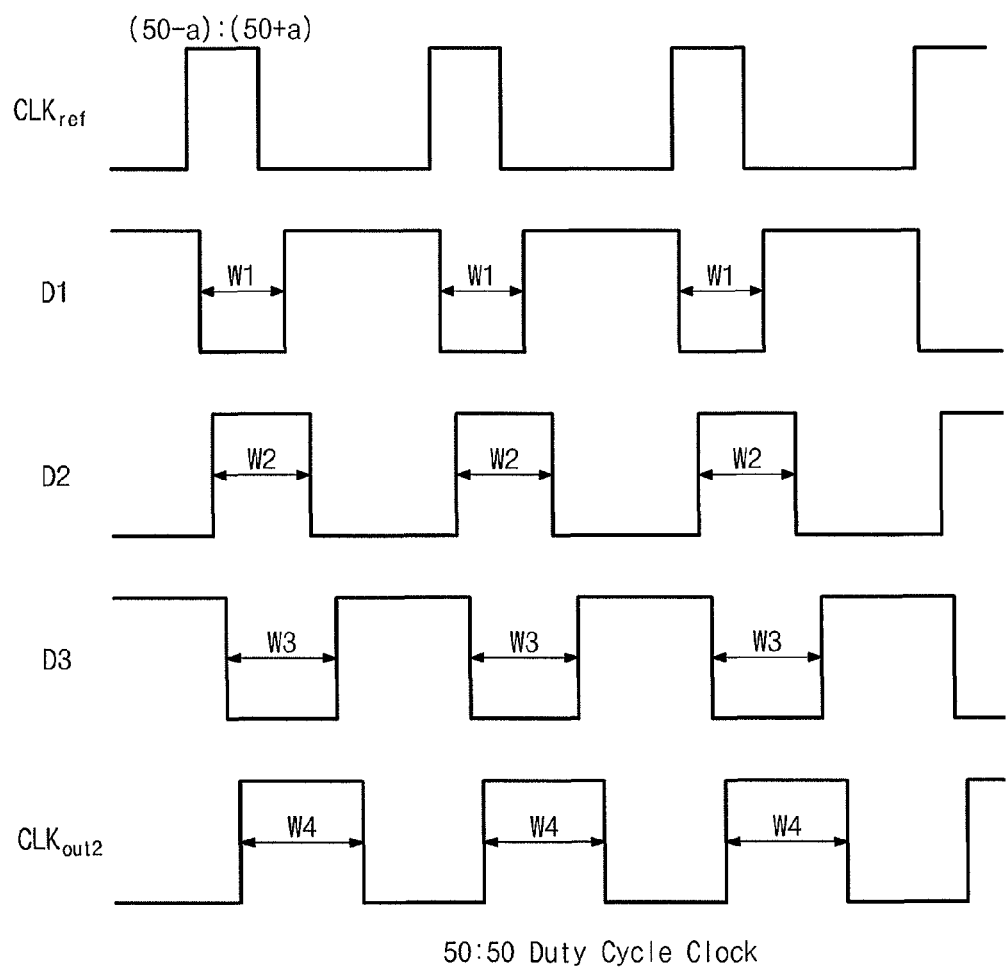
FIGS. 3 and 4 illustrate timing diagrams of an exemplary duty correction operation of the DCC shown in FIG. 2.
Figure 4:
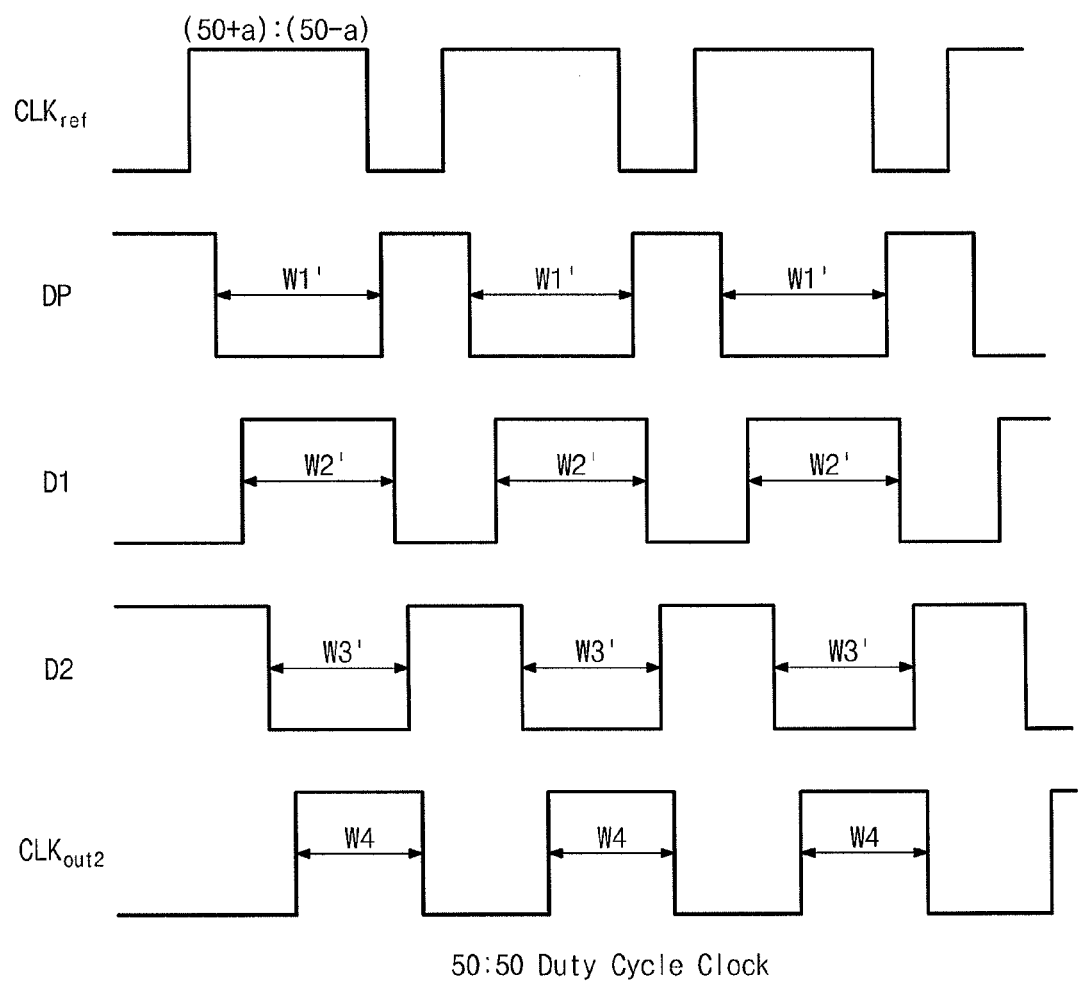

FIGS. 3 and 4 illustrate timing diagrams of an exemplary duty correction operation of the DCC shown in FIG. 2.

Referring to FIGS. 2 and 3, the skewed gate D1 may have a relatively small logic threshold. That is, e.g., a rising transition may occur relatively fast while a falling transition may occur relatively slow. In one or more embodiments, if a skewed gate having a leaning operation characteristic is configured in the form of a chain, e.g., such as the exemplary chain shown in FIG. 2, a duty correction may be done irrespective of delay mismatch.

For example, in the exemplary case of FIG. 3, a duty cycle of a clock for correction CLKref is "(50−a):(50+a)" and a period of a high pulse is relatively short. The value of "a" may correspond to an amount of error in the duty cycle. In such cases, a high pulse may be widened and/or a low pulse may be shortened to obtain a duty cycle of 50:50. More particularly, in the exemplary case of FIG. 3, to establish a 50:50 duty cycle, the period of the high pulse may be widened by, e.g., controlling a rising edge transition to occur at a relatively high speed and a falling edge transition to occur at a relatively low speed.

In such cases, the clock for correction CLKref may be passed through a low skewed gate D1. If the clock for correction CLKref passes the low skewed gate D1, a phase of the clock CLKref may be inverted and may correspond to a waveform D1 shown in FIG. 3. The clock for correction CLKref may then pass a high skewed gate D2. An output after passing the high skewed gate D2 may correspond to a waveform D2 shown in FIG. 3. Thereafter, if the waveform D2 passes a low-skewed gate D3, it may correspond to a waveform D3 shown in FIG. 3.

Referring to FIG. 3, in one or more embodiments, such an expansion process using, e.g., skewed gates (e.g., D1, D2 . . . ), may result in an output clock CLKout2 having a relatively high-pulse width W4. That is, the high pulse width W4 of the output clock CLKout2 may be wider than the high-pulse width W2 of a clock output from the high skewed gate D2 (corresponding to the waveform D2). More particularly, in one or more embodiments, a pulse width W4 of the output clock CLKout2 may be controlled using, e.g., skewed gates D1, D2, D3, such that a high-pulse width W4 of the output clock CLKout2 may be equal to a low-pulse width thereof so as to have a 50:50 duty ratio.

Referring to FIG. 2, in one or more embodiments, an output clock CLKout2, which may be output through the multiplexer 230 using, e.g., such a high-pulse expansion operation using one or more of the skewed gates D1, D2, etc., may result in the output clock CLKout2 having an accurate duty cycle of 50:50 (duty ratio of 50 percent). For example, the duty correction control data may determine an amount of duty correction necessary to establish a duty cycle of 50:50. In one or more embodiments, a value corresponding to an error of a duty cycle, e.g., the duty correction value output by the DCD 310, may determine how many of the skewed gates D1, D2, etc., of the duty correction circuit 200 may be passed. More particularly, e.g., the number of enabled NAND gates in the skewed gate chain depends on a value of the "a" in "(50−a):(50+a)".

Another exemplary case is illustrated in FIG. 4. In the exemplary case of FIG. 4, a duty cycle of a clock for correction CLKref is (50+a):(50−a) and a period of low pulse is relatively short. In such cases, a low pulse width may be widened and/or a high pulse width may be shortened to obtain a duty cycle of 50:50. More particularly, in the exemplary case of FIG. 4, to establish a 50:50 duty cycle, the period of the high pulse may be shortened by, e.g., controlling a rising edge transition to occur at a relatively low speed and a falling edge transition to occur at a relatively high speed.

In such cases, a high skewed gate may be controlled and the clock for correction CLKref may be passed through the high skewed gate. More particularly, in one or more embodiments, referring to FIGS. 2 and 4, the input multiplexer 203 may select an output of a pre-skewed gate DP having a high characteristic as an input. An input of a skewed gate D1 may be the output of the pre-skewed gate DP. In such cases, the clock for correction CLKref may pass the skewed gates DP, D1, and D2 in sequence. In the timing diagram of FIG. 4, waveforms of respective outputs passing the skewed gates DP, D1, and D2 and an output clock CLKout2 passing the multiplexer 230 are shown. More particularly, in one or more embodiments, a pulse width W4 of the output clock CLKout2 may be controlled using, e.g., skewed gates DP, D1, D2, such that a high-pulse width W4 of the output clock CLKout2 may be equal to a low-pulse width thereof so as to have a 50:50 duty ratio. That is, the high pulse width W4 of the output clock CLKout2 may be made smaller than a high-pulse width W2 of a clock output at the low skewed gate D1.

Referring to FIGS. 2 and 4, the output clock CLKout2 finally output through the multiplexer 230 using such a low-pulse compression operation may result in the output clock CLKout2 accurately having a duty cycle of 50:50 (duty ratio of 50 percent).

In one or more embodiments, the duty correction control data may determine an amount of duty correction necessary to establish a duty cycle of 50:50. In one or more embodiments, a value corresponding to an error of a duty cycle, e.g., the duty correction value output by the DCD 310, may determine how many of the skewed gates DP, D1, D2, etc., of the duty correction circuit 200 may be passed. More particularly, e.g., the number of enabled NAND gates in the skewed gate chain depends on a value of the "a" in "(50+a):(50−a)".

Figure 5:
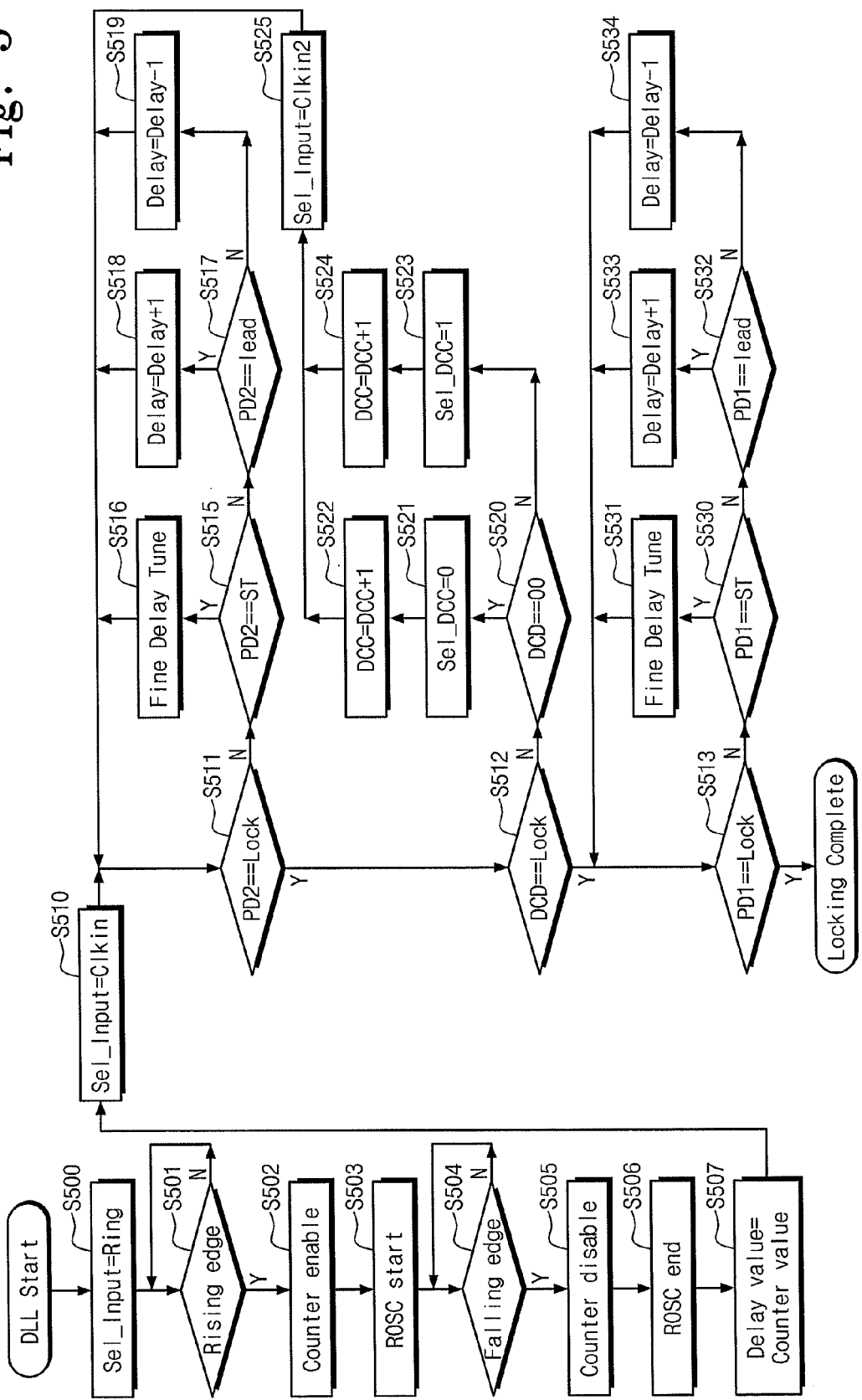
FIG. 5 illustrates a flow chart of an exemplary delay locking operation including a duty correction operation that may be implemented by the DLL of FIG. 1.

FIG. 5 illustrates a flow chart of an exemplary delay locking operation including a duty correction operation that may be implemented by the DLL of FIG. 1. More particularly, FIG. 5 illustrates a flow chart of an initial delay estimation operation, a duty cycle correction operation, and a DLL operation synchronizing a phase of an output clock with a phase of an input clock. The initial delay estimation operation may correspond to S500-S507 of FIG. 5. The duty cycle correction operation may correspond to S511, S512, S515-S519, and S520-S525 of FIG. 5. More particularly, the duty cycle correction operation may include synchronizing a falling edge of the clock for duty correction $CLK_{DCC}$ and a rising edge of the output clock $CLK_{out}$ (S511, and S151-S519 of FIG. 5). The DLL operation synchronizing a phase of an output clock with a phase of an input clock may correspond to S513, and S30-S534 of FIG. 5. These operations will be described below in more detail with reference to FIG. 6.

Figure 6:
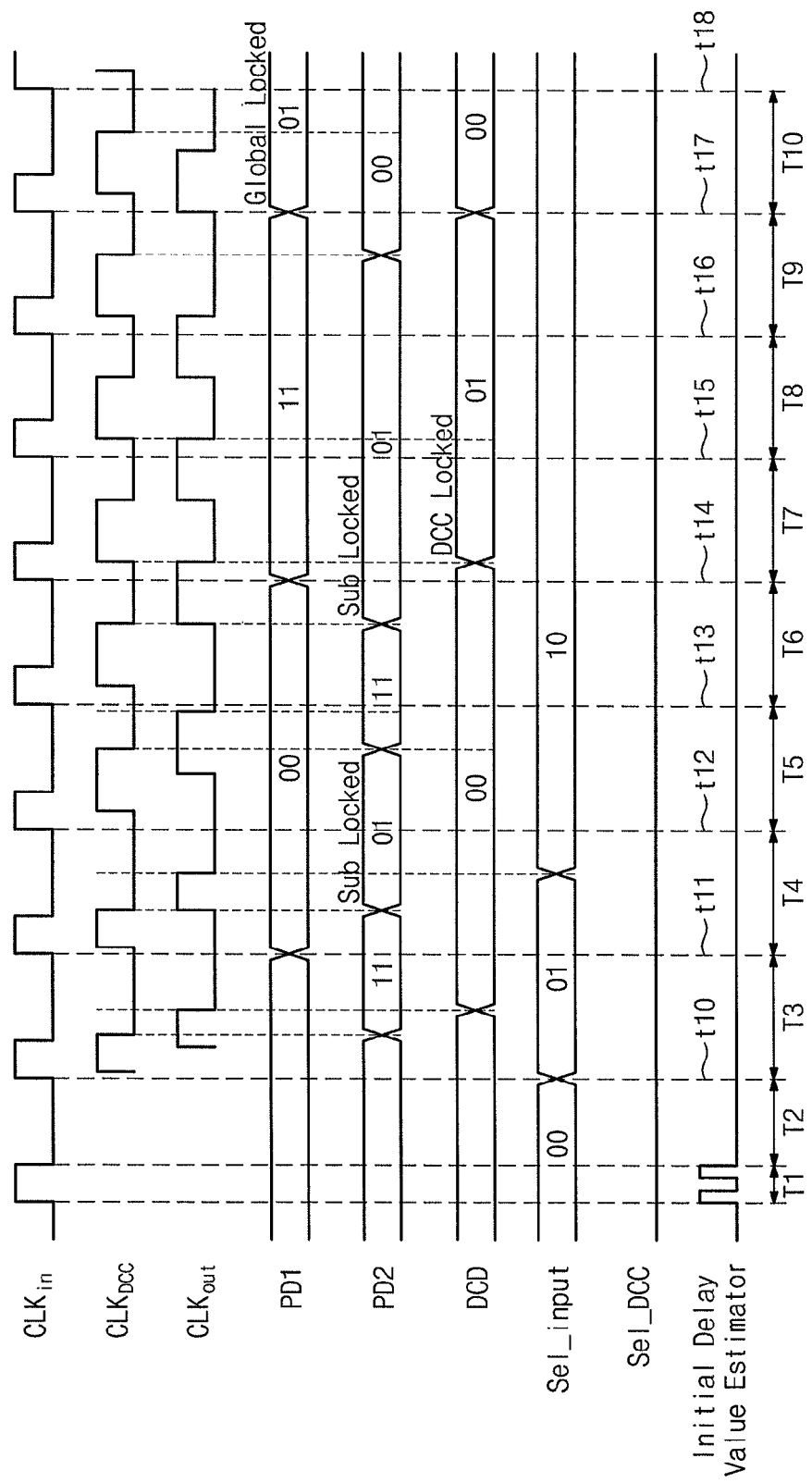
FIG. 6 illustrates a timing diagram of exemplary signals employable for operation of the DLL of FIG. 1.

FIG. 6 illustrates a timing diagram of exemplary signals employable for operation of the DLL of FIG. 1. Referring to FIGS. 1 and 6, a waveform CLKin corresponds to an input clock that may be applied through a line L1. A waveform $CLK_{DCC}$ corresponds to a clock for duty correction, which may be supplied through the line L9 during a duty correction operation. A waveform $CLK_{out}$ corresponds to an output clock output through the output node NO1. A waveform PD1 corresponds to an output data waveform of the FPD 314 output through the line L22. A waveform PD2 corresponds to an output data waveform of the SPD 312 output through the line L21. A waveform DCD corresponds to an output data waveform of the DCD 310 output through the line L20. A waveform Sel_input corresponds to an output data waveform from the DLC 400 for selecting an output of the multiplexer 30 through a line L12. A waveform Sel_DCC indicates an output data waveform for controlling a multiplexer of the DCC 200 output through a line L3. In addition, a waveform Initial Delay Value Estimator is valid at a time period T1 and is an example of a counting pulse of the initial delay estimator described above with regard to FIG. 1.

An overall exemplary operation including a duty correction operation and a DLL operation in FIG. 1 will be described with reference FIGS. 5 and 6. It should be understood that embodiments are not limited thereto.

Referring to FIGS. 1, 5, and 6, an operation may begin when an input is selected (S500). Referring to FIG. 5, during S500, input selection may correspond to the initial ring oscillator (Sel_Input=Ring). After the input is selected, the input clock CLKin may be monitored to detect a rising edge of the selected input clock CLKin (S501). After the rising edge of the input clock CLKin is detected (S501=Yes), the counter 800 may be enabled (S502) and the ROSC 700 may be started (S503). More particularly, the DLC 400 may control the counter 800 and the ROSC 700 so as to enable the counter 800 and start the ROSC 700 when the input is selected (S500) and the rising edge is detected (S501=Yes). A falling edge of may then be detected (S504). After the falling edge of the input clock CLKin is detected (S504=Yes), the counter 800 may be disabled S505 and the ROSC 700 may be stopped (S506). More particularly, the DLC 400 may control the counter 800 and the ROSC 700 so as to disable the counter 800 and stop the ROSC 700. Referring to FIGS. 5 and 6, operations S500 to S507 described above may be performed during period T1.

During the period T1, a high-pulse width of an input clock CLKin may be measured. As shown in FIG. 6, the high-pulse width of the input clock CLKin, i.e., length of time the input clock CLKin is maintained at a high state during the period T1, may be determined by counting a number of oscillations of the initial ring oscillator. That is, the counter 800 may count the number of oscillations of the initial ring oscillator. In one or more embodiments, the NAND gate 40, the multiplexer 30, the fine delay line 500, the NAND gates N2 and N3 may correspond to the initial ring oscillator. More particularly, the DLC 400 may apply the selection control signal S2 through a line L14 as Sel_input=00, e.g., corresponding to a portion of waveform Sel_input of FIG. 6, and the initial ring oscillator may be activated. Referring to FIG. 1, the 3:1 multiplexer 30 may provide an output of the NAND gate 40 applied through the line L7 to the line L9, connected to a multiplexing output terminal.

More particularly, e.g., operation of the initial ring oscillator may start with the rising edge of the input clock CLKin and the enablement of the ROSC 700. The counter 800 may receive an oscillation output signal output from the initial ring oscillator and may count the number of falling edges of the oscillation output signal. In one or more embodiments, only the high-pulse length of the input clock CLKin may be counted during T1.

Referring to the exemplary embodiment of FIG. 6, during the period T1, since the falling edge of the oscillation output signal is counted twice during the high-pulse length of the input clock CLKin. Thus, an initial delay estimator may set an initial coarse delay value to "2" according to the twice-counted value during the period T2.

Since a delay estimation operation is completed at the period T2, the operation of the initial ring oscillator. That is, after the falling edge of the input clock CLKin is detected (S504=Yes), the counter 800 may be disabled (S505) and the ROSC 700 may be stopped (S506) such that the initial ring oscillator is also stopped.

A duty cycle correction operation and/or a DLL operation synchronizing a phase of an output clock with a phase of an input clock may be performed. During a period T3, the rising edge of the output clock $CLK_{out}$ may be aligned with the falling edge of the clock for duty correction $CLK_{DCC}$, and during a period T4, it may then be determined whether a duty cycle is 50:50.

More particularly, referring to FIGS. 1, 5 and 6, when the Sel_Input=CLKin (S510), corresponding to a portion of the waveform Sel_input of FIG. 6 where the waveform Sel_input=01, the input clock CLKin applied through the line L1 may appear at an output line L9 of the multiplexer 30. More particularly, at a start time t10 of the period T3, the DLC 400 may apply the selection control signal S2 as Sel_input=01 of the waveform Sel_input illustrated in FIG. 6. Thus, the 3:1 multiplexer 30 may provide the input clock CLKin applied through the line L1 to the line L9 connected to the multiplexing output terminal after receiving the input clock CLKin. From the period T3, a clock signal appearing at the line L9 may correspond to the clock for duty cycle correction $CLK_{DCC}$.

More particularly, during the period T3, the SPD 312 may determine whether the falling edge of the clock for duty correction $CLK_{DCC}$ and the rising edge of the output clock $CLK_{out}$ are synchronized or aligned with each other (S511). If they are not synchronized or aligned, the routine proceeds to check whether a state transition ST occurs (S515), e.g., rising edge, falling edge, etc. That is, since quasi-synchronization is established when there is a state transition ST, if a state transition ST occurs fine delay tuning may be executed (S516). If there is no state transition ST (during S515), phases of the clocks $CLK_{DCC}$ and $CLK_{out}$ may be compared with each other (S517). Based on a result of the comparison during S517, an amount of delay time may be increased (S518) or an amount of delay time may be decreased (S519).

The determination of whether the falling edge of the clock for duty correction $CLK_{DCC}$ and the rising edge of the output clock $CLK_{out}$ are synchronized or aligned with each other may be conducted by making the SPD 312 sample the output clock $CLK_{out}$ at points of time after and before the falling edge of the clock for duty correction $CLK_{DCC}$. When PD2 corresponds to alignment, e.g., lock state (S511=Yes), the process may proceed to S512. When PD2 corresponds to not aligned, e.g., unlocked state (S511=No), the process may proceed to S515.

More particularly, during S511, when the alignment determination by the SPD 312 determines that the rising edge of the output clock $CLK_{out}$ leads the falling edge of the clock for duty correction $CLK_{DCC}$, a detection output value of the SPD 312 is output as "11" as shown in a waveform PD2 in FIG. 6. The DLC 400 may apply a delay control signal through the line L13, and the FDL 500 and the CDL 600 may enable an internal fine or coarse delay cell in response to the delay control signal to increase an amount of delay time (S518). In one or more embodiments, when the rising edge of the output clock $CLK_{out}$ leads the falling edge of the clock for duty correction $CLK_{DCC}$ during the period T3, a detection output value of the waveform PD2 may be output as "11" and the FDL 500 or the CDL 600 may increase the amount of delay time.

During S511, when the alignment determination by the SPD 312 determines that the rising edge of the output clock $CLK_{out}$ lags behind the falling edge of the clock for duty correction $CLK_{DCC}$, the detection output value is output as "00" in the waveform PD2 (i.e., instead of the output "01" in the waveform PD2 shown during the period T4 of FIG. 6). The DLC 400 may apply a delay control signal through the line L13, and the FDL 500 or the CDL 600 may decrease an amount of delay time (S519). In one or more embodiments, when the rising edge of the output clock $CLK_{out}$ lags the falling edge of the clock for duty correction $CLK_{DCC}$ during the period T3, a detection output value of the waveform PD2 may be output as "00" and the FDL 500 or the CDL 600 may decrease the amount of delay time.

In the exemplary embodiment of FIG. 6, during the period T4, the rising edge of the output clock $CLK_{out}$ may be synchronized or aligned with the falling edge of the clock for duty correction $CLK_{DCC}$ by, e.g., the delay increasing operation performed during the period T3. When the rising edge of the output clock $CLK_{out}$ is synchronized or aligned with the falling edge of the clock for duty correction $CLK_{DCC}$ by, e.g., the delay increasing operation performed during the period T3, PD2=Lock (S511=Yes) and the process proceeds. Accordingly, a detection output value of the SPD 312 is output as "01" as shown at the waveform PD2.

In one or more embodiments, a sub-locked state may be established between the output clock $CLK_{out}$ and the clock for duty correction $CLK_{DCC}$. During the period T4, at points in time after and before the falling edge of the output clock $CLK_{out}$, the DCD 310 may sample the clock for duty correction $CLK_{DCC}$ to determine whether a duty cycle of the output clock $CLK_{out}$ is 50:50 (S512).

If a determination result is that the duty clock is "(50−a): (50+a)" (S520=Yes), the detection output value of the DCD 310 is "00," and the process may proceed (S521 and S522). If the determination result is that the duty cycle is "(50−a):(50+a)" (S520=No), e.g., the duty cycle is "(50+a):(50−a)", the detection output value of the DCD 310 is "11," and the process may proceed (S523 and S524). If the detection result is that the duty cycle is "50:50", the detection output value of the DCD 310 is "01". Referring to FIG. 6, if the detection result is that the duty cycle is "50:50" (S512=Yes), the process may proceed to S513.

Referring to FIG. 6, during the period T4, the duty cycle is "(50−a):(50+a)" (as shown in example of FIG. 3). Therefore, it will be understood that the detection output value of the DCD 310 is expressed as "00". If the detection output value of the DCD 310 is "00", the DLC 400 may output a DCC control signal through a line L10 and may output the mode selection signal S1 through the line L3.

More particularly, in some cases, the duty cycle is "(50−a):(50+a)" and the high-pulse width may be increased so as to provide a duty ratio "50:50," as described above with regard to FIG. 3. Operation of the DCC 200 may be started accordingly (S521). In such cases, the mode selection signal S1 may be output as "0" (S521) as shown in the waveform Sel_DCC shown in FIG. 6. Referring to FIGS. 1, 2 and 6, the 2:1 multiplexer 203 may provide the input clock CLKin applied through the line L1 as an input of the NAND gate 206 of the skewed gate D1. If the input clock CLKin sequentially passes the NAND gate 206 and a cascade-connected NAND gate 210, the order of passing a skewed gate chain is low-high-low-high, as described above, e.g., with regard to FIG. 3. The 2:1 multiplexer 230 may provide an output of the NAND gate 224 to the line L5 after selecting the output of the NAND gate 224.

An output clock CLKout2 of a duty-cycle-corrected skewed gate chain appearing at the line L5 may be used as a third input of the 3:1 multiplexer 30 when the DLC 400 applies the selection control signal S2 as Sel_input=10 as shown in the waveform Sel_input in FIG. 6.

It is understood that in cases in which "(50−a):(50+a)," one or more features described above with regard to FIGS. 2 and 3, may be employed during S521, S522, and/or S525. It is understood that in cases in which "(50+a):(50−a)," one or more features described above with regard to FIGS. 2 and 4, may be employed during S523, S524, and/or S525.

More particularly, as described above, the number of enabled NAND gates in the skewed gate chain may depend on a value of the "a" in "(50−a):(50+a)". As a result, the number of enabled NAND gates in the skewed gate chain may be determined according to the DCC control signal output through the line L10.

In the exemplary embodiment of FIG. 6, during the period T5, the alignment between the falling edge of the clock for duty correction $CLK_{DCC}$ and the rising edge of the output clock CLKout is broken down again due to the delay of a skewed gate chain in the DCC 200. Therefore, a synchronization or alignment operation may be performed again during the period T5. That is, since the sub-locked state is broken down, the sub-locked state again may be established again.

If the alignment is broken down during the period T5, a detection output value of the SPD 312 may be expressed as "11" again, as shown in the exemplary waveform PD2 in FIG. 6. Accordingly, as described above, the FDL 500 or the CDL 600 may increase an amount of the delay as the DLC 400 outputs a delay control signal based on a duty correction value from, e.g., the DCD 310.

Thus, during a period T6 of the exemplary embodiment illustrated in FIG. 6, a phase of the output clock $CLK_{out}$ may be further delayed to re-align the rising edge of the output clock $CLK_{out}$ with the falling edge of the clock for duty correction $CLK_{DCC}$. If the alignment is completed during the period T6, the DCD 310 may confirm whether a duty cycle ratio is 50:50 percent during a period T7. When the duty cycle ratio is 50:50 percent, a detection output value may be "01". When the output of the DCD 310 is "01", a DCC-locked state may be generated during the period T7, as shown in the exemplary waveform DCD in FIG. 6.

In the exemplary embodiment of FIG. 6, during periods T8 and T9, the rising edge of the output clock $CLK_{out}$ and the falling edge of the clock for duty correction $CLK_{DCC}$ are aligned with each other while a duty cycle of the output clock $CLK_{out}$ is 50:50, and the output clock $CLK_{out}$ has a phase difference of about half a cycle with respect to the input clock CLKin. Thus, the output clock $CLK_{out}$ may be delayed about a half cycle to finally synchronize a phase of the input clock CLKin with a phase of the output clock $CLK_{out}$.

In the exemplary embodiment of FIG. 6, at this point, since the current state is already the DCC-locked state (S512=Yes), an amount of the delay of the FDL 500 or the CDL 600 may be adjusted through the FPD 314 in FIG. 1. In one or more embodiments, the FPD 314 may compare a phase of the input clock CLKin with a phase of the output clock $CLK_{out}$ and may output a detection output value based on a comparison result as "11," as shown in the exemplary waveform PD1 in FIG. 6 (S513). Accordingly, the delay amount of the FDL 500 or the CDL 600 may be adjusted, e.g., increased. As a result, the phase of the input clock CLKin and the phase of the output clock $CLK_{out}$ having a duty ratio of 50:50 percent may be synchronized at time t17, corresponding to an end of the period T9 and a start of a period T10. When these phases are synchronized, the FPD 314 in FIG. 1 may output the detection output value as "01", as shown in the exemplary waveform PD1 in FIG. 6.

If the detection output value of the FPD 314 is output as "01" at the start point (t17) of the period T10 as shown at the waveform PD1 (passes an operation S513), the DLC 400 may determine that the rising edge of the input clock CLKin and the rising edge of the output clock CLKout having a duty ratio of 50:50 percent are synchronized with each other. Thus, in one or more embodiments, the output clock $CLK_{out}$ appearing at the period T10 may be a clock that has a duty cycle of 50:50 and is accurately synchronized with the input clock CLKin.

One or more embodiments of a delay locked loop (DLL) employing one or more aspects described herein may be configured using a full digital system. One or more embodiments of a DLL employing one or more aspects described herein may have a relatively high DCC accuracy irrespective of delay mismatch arising from process variation. One or more embodiments of a DLL may have a wide duty cycle correction range and fast locking time. One or more embodiments of a DLL may be free from a harmonic locking problem.

Figure 7:
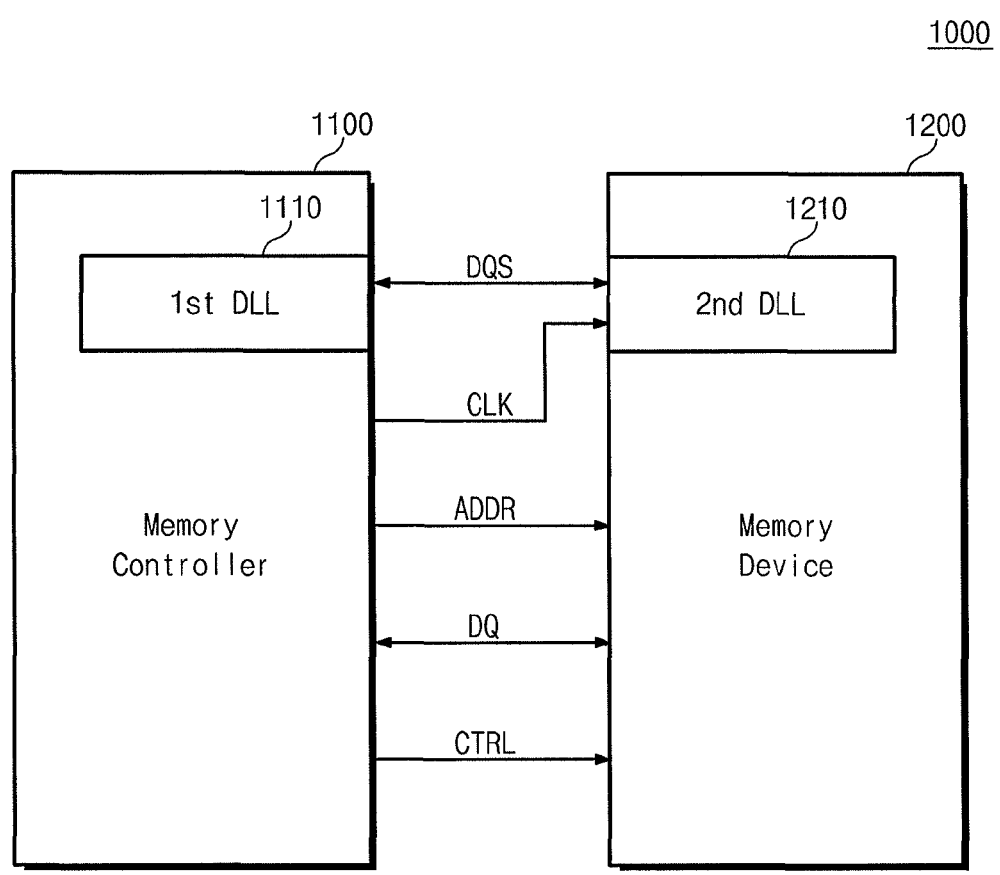
FIGS. 7 and 8 illustrate block diagrams of exemplary embodiments of data processing systems including the DLL of FIG. 1.
Figure 8:
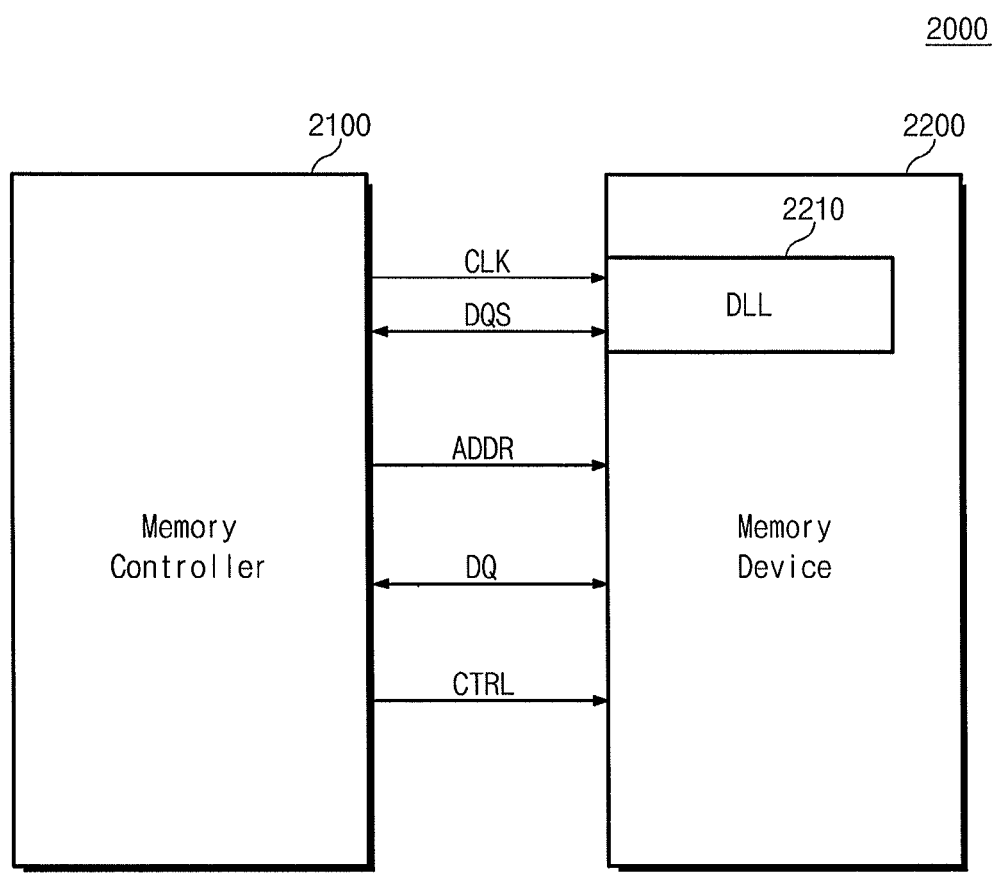

FIGS. 7 and 8 illustrate block diagrams of exemplary embodiments of data processing systems including the DLL of FIG. 1.

Referring to FIG. 7, a data processing system 1000 such as a memory system may include a memory controller 1100 and a memory device 1200.

The memory controller 1100 may transmit a clock signal CLK, an address signal ADDR, a data strobe signal DQS, a data input/output signal DQ, and control signals CTRL to the memory device 1200. The memory device 1200 may transmit the data strobe signal DQS and the data input/output signal DQ to the memory controller 1100. For example, the memory device 1200 may be a semiconductor memory device such as a DRAM or an SRAM.

The data strobe signal DQS may be generated at a first delay locked loop (DLL) 1110 in the memory controller 1100 and may be output in synchronization with the data input/output signal DQ. The data strobe signal DQS may be applied to a second DLL 1210 of the memory device 1200. The second DLL 1210 may be synchronized with the clock signal CLK to latch the data input/output signal DQ applied to the memory device 1200 and may generate a duty-corrected output clock signal. In one or more embodiments, the second DLL 1210 in FIG. 7 may be embodied as a DLL including the same structure as shown in FIG. 1. In one or more embodiments, the first DLL 1110 in FIG. 7 may also be embodied as the DLL in FIG. 1.

Referring to FIG. 8, a data processing device 2000, e.g., a memory system, may include a memory controller 2100 and a memory device 2200. In general, only differences between the exemplary data processing system 2000 of FIG. 8 and the exemplary data processing system 1000 of FIG. 7 will be described below. In the exemplary embodiment of FIG. 7, a DLL is not included in the memory controller 2100. A DLL 2210 may be included the memory device 2200. The DLL 2210 may include the same structure as shown in FIG. 1.

One or more embodiments may be configured to implement duty correction using a skewed gate chain. One or more embodiments may provide a delay locked loop (DLL) that may be easily implemented and may have a relatively wide duty correction range. One or more embodiments may be configured such that a locking operation of the DLL may be obtained within a relatively short time such that the DLL may be free from a harmonic locking problem and may be suitably adopted in a data processing system including a highly integrated-low power-high speed-semiconductor memory device. One or more embodiments may enable a duty correction operation to be performed in spite of process variation irrespective of delay mismatch such that a duty ratio of more improved accuracy may be secured relative to comparable conventional devices.

Moreover, due to the use of an all-digital unit that is suitable for deep sub-micron technologies for mass production and may be easily designed, one or more embodiments of a DLL may be implemented at low cost. One or more embodiments may implement a duty correction operation having an accurate duty cycle of 50:50 percent irrespective of delay mismatch and may enable a maximum data valid window to be secured in a DDR-type high speed memory interface. One or more embodiments may implement a locking operation of a DLL to be secured within a short time, such that the DLL may be suitably adopted in a data processing system that is free from a harmonic locking problem, e.g., a high-speed semiconductor memory device.

One or more embodiments may provide a DCC having a wider duty cycle correction range, a more accurate duty correction operation, a faster locking time of a DLL, easier implementation, and/or a smaller area occupied by a chip relative to comparable conventional DCCs such as a conventional DCC implemented using a phase interpolator or an edge combiner. When a phase interpolator is used in a DLL, power consumption generally increases due to direct current (DC) and a correction range is relatively narrow. When an edge combiner is used in a DLL, a correction range may be relatively wide, but the duty correction accuracy may not be accurately secured due to delay mismatch between delay lines.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative. Thus, the scope of the inventive concept is to be determined by the broadest permissible interpretation of the following claims and their equivalents, and shall not be restricted or limited by the foregoing description.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A delay locked loop (DLL), comprising:
   a duty correction circuit configured to receive duty correction control data and including a skewed gate chain;
   a fine delay line and a coarse delay line configured to delay a selection input signal in response to delay control data;
   a phase detector configured to compare a phase of a clock for duty correction selected as the selection input signal with a phase of an output clock to generate a first detection value and compare a phase of an input clock with the phase of the output clock to generate a second detection value;
   a duty cycle detector configured to compare the phase of the output clock with the phase of the clock for duty correction to generate a duty detection value after the clock for duty correction and the output clock are aligned with each other; and
   a delay line controller configured to receive the first and second detection values and the duty detection value and to apply the duty correction control data and the delay control data to the duty correction circuit and the fine and coarse delay lines, respectively.

2. The DLL as claimed in claim 1, wherein the skewed gate chain of the duty correction circuit includes a plurality of skewed gates whose logic thresholds lean toward a rising or falling transition.

3. The DLL as claimed in claim 2, wherein each of the skewed gates includes a NAND gate.

4. The DLL as claimed in claim 1, further comprising:
   an initial delay estimator configured to output a counting value obtained by measuring a first state pulse width of the input clock applied during an early stage of operation of the DLL.

5. The DLL as claimed in claim 4, wherein the first state pulse width is a period during which the input clock is maintained at a high level.

6. The DLL as claimed in claim 1, wherein the phase detector generates the first detection value by sampling the output clock at a first transition of the clock for duty correction and generates the second detection value by sampling the output clock at a second transition of the input clock.

7. The DLL as claimed in claim 1, wherein the duty cycle detector generates the duty detection value by sampling the clock for duty correction at a first transition of the output clock after aligning a second transition of the output clock with the first transition of the clock for duty correction.

8. The DLL as claimed in claim 7, wherein the first transition is a falling edge and the second transition is a rising edge.

* * * * *